US012581925B2

(12) United States Patent
Lo et al.

(10) Patent No.: US 12,581,925 B2
(45) Date of Patent: Mar. 17, 2026

(54) SELECTIVE METAL CAP IN AN INTERCONNECT STRUCTURE

(71) Applicant: Taiwan Semiconductor Manufacturing Co., Ltd., Hsinchu (TW)

(72) Inventors: Wei-Jen Lo, Hsinchu (TW); Syun-Ming Jang, Hsinchu (TW); Ming-Hsing Tsai, Chu-Pei (TW); Chun-Chieh Lin, Taichung (TW); Hung-Wen Su, Jhubei (TW); Ya-Lien Lee, Baoshan Township (TW); Chih-Han Tseng, Tainan (TW); Chih-Cheng Kuo, Taipei (TW); Yi-An Lai, Hsinchu (TW); Kevin Huang, Hsinchu (TW); Kuan-Hung Ho, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 365 days.

(21) Appl. No.: 18/313,746

(22) Filed: May 8, 2023

(65) Prior Publication Data

US 2024/0274555 A1     Aug. 15, 2024

Related U.S. Application Data

(60) Provisional application No. 63/484,231, filed on Feb. 10, 2023.

(51) Int. Cl.
*H01L 21/768* (2006.01)
*H01L 23/00* (2006.01)

(52) U.S. Cl.
CPC .. *H01L 21/76847* (2013.01); *H01L 21/76804* (2013.01); *H01L 21/76834* (2013.01); *H01L 21/7684* (2013.01); *H01L 21/76846* (2013.01); *H01L 21/76877* (2013.01); *H01L 24/03* (2013.01); *H01L 24/05* (2013.01); *H01L 2224/0239* (2013.01); *H01L 2224/0384* (2013.01); *H01L 2224/05073* (2013.01); *H01L 2224/05184* (2013.01); *H01L 2224/05582* (2013.01)

(58) Field of Classification Search
CPC ...................................... H01L 21/768
See application file for complete search history.

(56) References Cited

U.S. PATENT DOCUMENTS

| | | | |
|---|---|---|---|
| 9,947,582 B1 * | 4/2018 | Kuroda | ............. H01L 21/28562 |
| 2007/0054489 A1 | 3/2007 | Wong et al. | |
| 2009/0218691 A1 | 9/2009 | Yang et al. | |
| 2010/0081274 A1 | 4/2010 | Ishizaka et al. | |

(Continued)

FOREIGN PATENT DOCUMENTS

| | | | |
|---|---|---|---|
| JP | 2004096052 | * | 3/2004 |
| KR | 20110081155 A | | 7/2011 |

(Continued)

*Primary Examiner* — Matthew L Reames
(74) *Attorney, Agent, or Firm* — Slater Matsil, LLP

(57) ABSTRACT

Embodiments provide a method and resulting structure that includes forming an opening in a dielectric layer to expose a metal feature, selectively depositing a metal cap on the metal feature, depositing a barrier layer over the metal cap, and depositing a conductive fill on the barrier layer.

20 Claims, 5 Drawing Sheets

(56)                    References Cited

U.S. PATENT DOCUMENTS

2011/0024909 A1      2/2011  Yang et al.
2013/0171819 A1 *    7/2013  Miyajima  ......... H01L 21/76811
                                                         257/E21.585
2022/0068826 A1      3/2022  Kuo et al.

FOREIGN PATENT DOCUMENTS

KR      20220026452  A      3/2022
TW        200943484  A    10/2009
TW        201027625  A      7/2010
TW        202209612  A      3/2022

* cited by examiner

SELECTIVE METAL CAP IN AN INTERCONNECT STRUCTURE

PRIORITY CLAIM AND CROSS-REFERENCE

This application claims the benefit of U.S. Provisional Application No. 63/484,231, filed on Feb. 10, 2023, which application is hereby incorporated herein by reference.

BACKGROUND

Generally, active devices and passive devices are formed on and in a semiconductor substrate. Once formed, these active devices and passive devices may be connected to each other and to external devices using a series of conductive and insulating layers. These layers may help to interconnect the various active devices and passive devices as well as provide an electrical connection to external devices through, for example, a contact pad.

To form these interconnections within these layers, a series of photolithographic, etching, deposition, and planarization techniques may be employed. However, the use of such techniques has become more complicated as the size of active and passive devices have been reduced, causing a reduction in the size of the interconnects to be desired as well. As such, improvements in the formation and structure of the interconnects is desired in order to make the overall devices smaller, cheaper, and more efficient with fewer defects or problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1A, 1B, 2A, 2B:
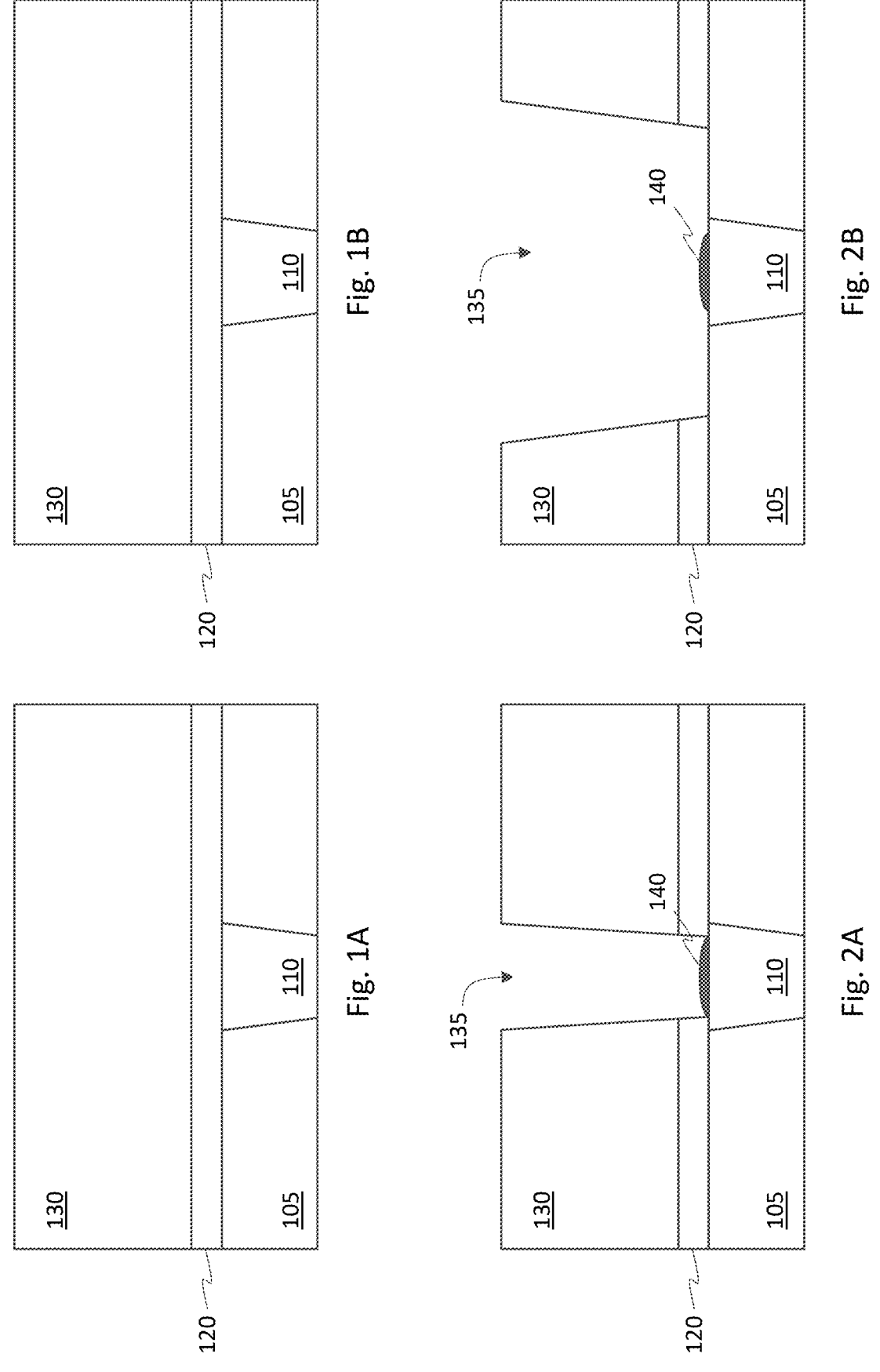
FIGS. 1A, 2A, 3A, 4A, 5A, 6A, and 7A illustrate cross-sectional views of various intermediate stages of fabrication of an interconnect feature, in accordance with some embodiments.
FIGS. 1B, 2B, 3B, 4B, 5B, 6B, and 7B illustrate cross-sectional views of various intermediate stages of fabrication of an interconnect feature, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the cross-section dimensions of interconnects are continuously scaling down, any oxidation present at the interface of one metal structure and another metal structure will occupy a greater percentage of the cross-section area. As a result, as the dimensions scale down, resistivity at those interfaces tends to scale up. Different strategies have been employed to reduce the oxidation at the interface. One strategy is to perform a conventional pre-clean, for example, by a chemical cleaner to reduce oxidation at the interface. Conventional pre-clean processes, however, do not remove enough oxidation to avoid the high resistivity issues of smaller dimension interconnects. Another strategy is to perform a plasma assisted pre-clean, in which, a chemical cleaning gas is ignited into a plasma and used to remove oxidation at the interface. While this method can remove more oxidation, the sidewalls of the opening may become damaged so that a subsequently deposited barrier layer fails.

Embodiments discussed herein address this problem by selectively depositing a metal cap at the interface followed by a barrier layer and conductive fill. The selective deposition of the metal cap may be performed after a chemical pre-clean, so that at least some of the oxidation is removed. Then, the selective deposition of the metal cap provides excellent adherence and conductivity at the interface. Without breaking vacuum, a barrier layer and conductive fill may then be deposited so that a second interface between the metal cap and the barrier layer and a third interface between the barrier layer and the conductive fill is free from any noticeable oxidation.

Embodiments will be described with respect to a specific context, namely, an interconnect structure and a method of forming the same over a metal via. It should be appreciated that the described process may be performed at any level of an interconnect and may be performed in other contexts, such as at the bottom of a via.

FIGS. 1A and 1B through FIGS. 7A and 7B illustrate cross-section views of various intermediate stages of the fabrication of a metal element in an interconnect, in accordance with some embodiments. FIGS. 1A, 2A, 3A, 4A, 5A, 6A, and 7A are each taken along a first cross-section of a workpiece, for example along the x-direction in an x-y plane. As demonstrated below, these Figures illustrate embodiments where the opening for a metal element over a metal feature is narrower than or similar to the width of the metal feature underlying the opening. FIGS. 1B, 2B, 3B, 4B, 5B, 6B, and 7B are each taken along a second cross-section of the workpiece, for example along the x-direction in the x-y plane at a cross-section parallel to the cross-section of FIGS. 1A, 2A, 3A, 4A, 5A, 6A, and 7A. As demonstrated below, these Figures illustrate embodiments where the opening for a metal element over a metal feature is wider than the width of the metal feature underlying the opening. In each embodiment, the metal element may run in the y-direction for a desired length. FIGS. 1B, 2B, 3B, 4B, 5B, 6B, and 7B can also be understood as an example perpendicular cross-section in the y-direction to the corresponding FIGS. 1A, 2A, 3A, 4A, 5A, 6A, and 7A. In such instances, the opening distance D6 (see FIG. 7B) may be any suitable length.

In FIGS. 1A and 1B, a first dielectric layer 105 has a conductive feature 110 embedded therein. The first dielectric layer 105 may be any dielectric layer of a device, and the conductive feature 110 may be any conductive feature of a device, for example, a via, a metal line, a metal plate, an electrode, and so forth. In some embodiments, for example, the conductive feature 110 may be a via electrically coupled to an electrical input/output of a device. The first dielectric layer 105 may be, for example, an Inter-Layer Dielectric (ILD) or an Inter-Metal Dielectric (IMD). In accordance with some embodiments of the present disclosure, the first dielectric layer 105 is an ILD, in which contact plugs are formed. In accordance with other embodiments of the present disclosure, the first dielectric layer 105 is an IMD, in which metal lines and/or vias are formed.

The first dielectric layer 105 may be formed of any suitable material. In some embodiments, the first dielectric layer 105 may be formed of Phosphosilicate Glass (PSG), Borosilicate Glass (BSG), Boron-Doped Phosphosilicate Glass (BPSG), Fluorine-Doped Silicate Glass (FSG), a silicon oxide layer (formed using a Tetra Ethyl Ortho Silicate (TEOS) process), the like, or combinations thereof. In other embodiments, the first dielectric layer 105 may be formed of a low-k dielectric material, such as a carbon containing dielectric material, Hydrogen SilsesQuioxane (HSQ), MethylSilsesQuioxane (MSQ), another low-k dielectric material, the like, or combinations thereof.

The first dielectric layer 105 may be formed using spin-on coating, Atomic Layer deposition (ALD), Flowable Chemical Vapor Deposition (FCVD), Chemical Vapor Deposition (CVD), Plasma-Enhanced Chemical Vapor Deposition (PECVD), Low-Pressure Chemical Vapor Deposition (LPCVD), or the like. In some embodiment, the first dielectric layer 105 may be formed by depositing a porogen-containing dielectric material and then performing a curing process to drive out the porogen to form a dielectric layer that is porous.

Still referring to FIGS. 1A and 1B, a conductive feature 110 is formed in the first dielectric layer 105. The conductive feature 110 may be a metal line, a conductive via, a contact plug, or the like. In accordance with some embodiments, the conductive feature 110 includes a diffusion barrier layer and a conductive filling material over the diffusion barrier layer. The diffusion barrier layer may be formed of a conductive material such as titanium, titanium nitride, tantalum, tantalum nitride, the like, or combinations thereof. The conductive filling material may be formed of cobalt (Co), ruthenium (Ru), copper (Cu), molybdenum (Mo), tungsten (W), the like, or combinations thereof.

FIGS. 1A and 1B also illustrate an etch stop layer (ESL) 120 formed over the first dielectric layer 105 and the conductive feature 110. The ESL 120 is formed of a dielectric material, which may include one or more materials such as aluminum oxide, aluminum nitride, a silicon oxide, a silicon nitride, silicon carbide, silicon oxynitride, silicon carbonitride, silicon oxycarbonitride, the like, or combinations thereof. The ESL 120 may be formed of a material that has a high etching selectivity relative to the overlying second dielectric layer 130 such that an etching of the second dielectric layer 130 may stop on the ESL 120. In some embodiments, the ESL 120 may have a thickness that is between about 2 nm and about 5 nm. The ESL 120 may be formed by any suitable process, such as by spin-on coating, Atomic Layer deposition (ALD), Flowable Chemical Vapor Deposition (FCVD), Chemical Vapor Deposition (CVD), Plasma-Enhanced Chemical Vapor Deposition (PECVD), Low-Pressure Chemical Vapor Deposition (LPCVD), or the like.

The second dielectric layer 130 may be a dielectric layer like unto the first dielectric layer 105, and formed using materials and processes similar thereto. That is, the second dielectric layer 130 may be an IMD or ILD layer, and may be an oxide, a nitride, a carbon-containing dielectric material, the like, or combinations thereof. For example, the second dielectric layer 130 may be formed of PSG, BSG, BPSG, FSG, TEOS oxide, HSQ, MSQ, the like, or combinations thereof. In some embodiments, the second dielectric layer 130 is a low-k dielectric layer having a dielectric constant value (k) that is lower than about 3.5 or that is lower than about 3.0.

In FIGS. 2A and 2B, an opening 135 is formed through the second dielectric layer 130 and through the ESL 120 to expose the conductive feature 110. The opening 135 corresponds to a subsequently formed conductive structure, such as a via, a metal line, and the like. The opening 135 may be formed using, for example, suitable photolithography and etching techniques. In an example of a process of forming the opening 135, a photoresist mask may be formed over the second dielectric layer 130, patterned, and developed to define openings therein which correspond to the opening 135. The opening 135 may then be etched through the corresponding opening in the photoresist mask.

Initially, the second dielectric layer 130 is exposed through the corresponding opening in the photoresist mask. The exposed second dielectric layer 130 may then be etched to form an upper portion of the opening 135 extending through the second dielectric layer 130 that exposes the ESL. The etching of the second dielectric layer 130 may be performed using a wet etching process and/or a dry etching process (e.g., a plasma etching process). For example, the etching of the second dielectric layer 130 may be performed using a process gas containing fluorine, and may include one or more carrier gases such as Ar, $N_2$, or the like. After etching the second dielectric layer 130 to form the upper portion of the opening 135, an etching process is performed to etch through the ESL 120 to expose the conductive feature 110. The etching process on the ESL 120 may be any suitable etching process, such as a dry or wet etch. In one embodiment, the etching process may use a solution that includes dimethyl sulfide and/or $H_2O_2$, the like, or combinations thereof.

In some embodiments, after forming the opening 135, the resulting structure is transferred to a non-vacuum tool for forming subsequent layers, such as a barrier layer. In such embodiments, oxide layers 140 are formed on the exposed surfaces of the conductive features 110. The oxide layers 140 are native oxide layers. The oxide layer 140 can be an oxide of the material of the conductive features 110. As noted above, the oxide layer 140 may inhibit electrical signals from cleanly traversing the interface between the conductive features 110 and overlying conductive structures.

Figures 3A, 3B, 4A, 4B:
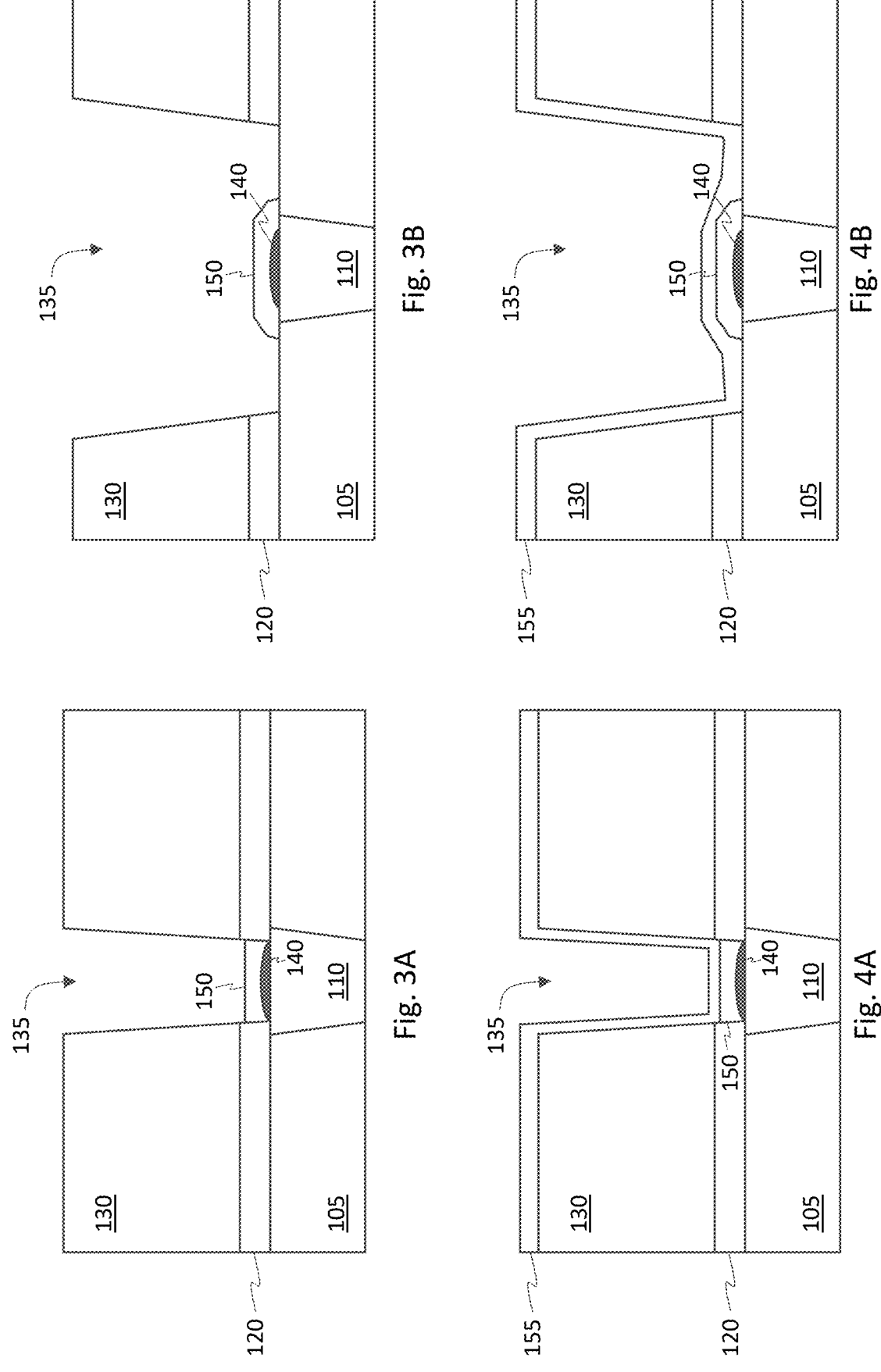

In FIGS. 3A and 3B, in some embodiments, a pre-deposition cleaning process may be performed on the opening 135 to remove some of the oxidation 140 from the conductive feature 110. The pre-deposition cleaning may include a chemical rinsing utilizing Functional DI-water, or the like, to reduce the oxidation 140 between about 20% and 60%. In some embodiments, the pre-deposition cleaning may include a plasma cleaning process performed on the opening 135 to remove some of the oxidation 140 from the conductive features 110. In such embodiments, the plasma cleaning process may be an $H_2$ remote plasma process with an ion filter, and performed at a temperature between about 300° C. and 350° C., at a pressure between about 0.2 Torr to 3 Torr. The $H_2$ plasma process removes oxidation by taking oxygen atoms from the oxide and combining them with the hydrogen to convert into water. In some embodiments, the pre-deposition cleaning may include both an $H_2$ plasma process and a chemical rinse. The $H_2$ plasma process and/or chemical rinse may also remove etch byproducts formed on sidewalls and bottoms of the openings 135 during the etching process for forming the openings 135. As noted above, however, the $H_2$ plasma process can damage the second dielectric layer 130, causing poor performance of the subsequently deposited barrier layer. As such it may be desirable to limit the $H_2$ plasma process, if used.

After the pre-deposition cleaning process, instead of depositing a barrier layer immediately, a metal cap 150 is selectively deposited on the exposed conductive feature 110. Selective deposition of the metal cap 150 prevents further oxidation of the conductive feature 110 and provides a larger contact area for the subsequently deposited barrier layer and conductive fill.

FIGS. 3A and 3B illustrate the selective deposition of the metal cap 150. In accordance with some embodiments, the metal cap 150 is formed through a selective depositing process, so that metal cap 150 is selectively deposited on the exposed surfaces of conductive features 110, and not on the exposed surfaces of dielectric materials such as the first dielectric layer 105, ESL 120, or second dielectric layer 130. In accordance with some embodiments, the selective deposition process may be performed through ALD or CVD. In accordance with some embodiments, metal cap 150 is formed of or comprises cobalt (Co), tungsten (W), tantalum (Ta), nickel (Ni), molybdenum (Mo), titanium (Ti), iron (Fe), or combinations thereof. When the metal cap 150 is deposited, the precursor may include a metal halide (such as $WCl_5$) or a metal organic material and a reducing agent such as $H_2$. The deposition process may be a thermal process performed at an elevated temperature, such as in the range between about 275° C. and about 500° C. The deposition may also be performed with plasma turned on.

In some embodiments, the metal cap 150 may be formed on the conductive features 110 such that portions of the metal cap 150 protrude laterally from the top surfaces of the conductive features 110 and extend along the upper surface of the first dielectric layer 105 (see FIG. 3B). For example, the metal cap 150 may protrude partially or completely over the upper surface of the first dielectric layer 105. In such embodiments, the metal cap 150 is not deposited on the first dielectric layer 105 due to the selective deposition technique, however, it may grow laterally along the upper surface of the first dielectric layer 105 from other portions of the partially deposited metal cap 150.

Figures 7A, 7B:
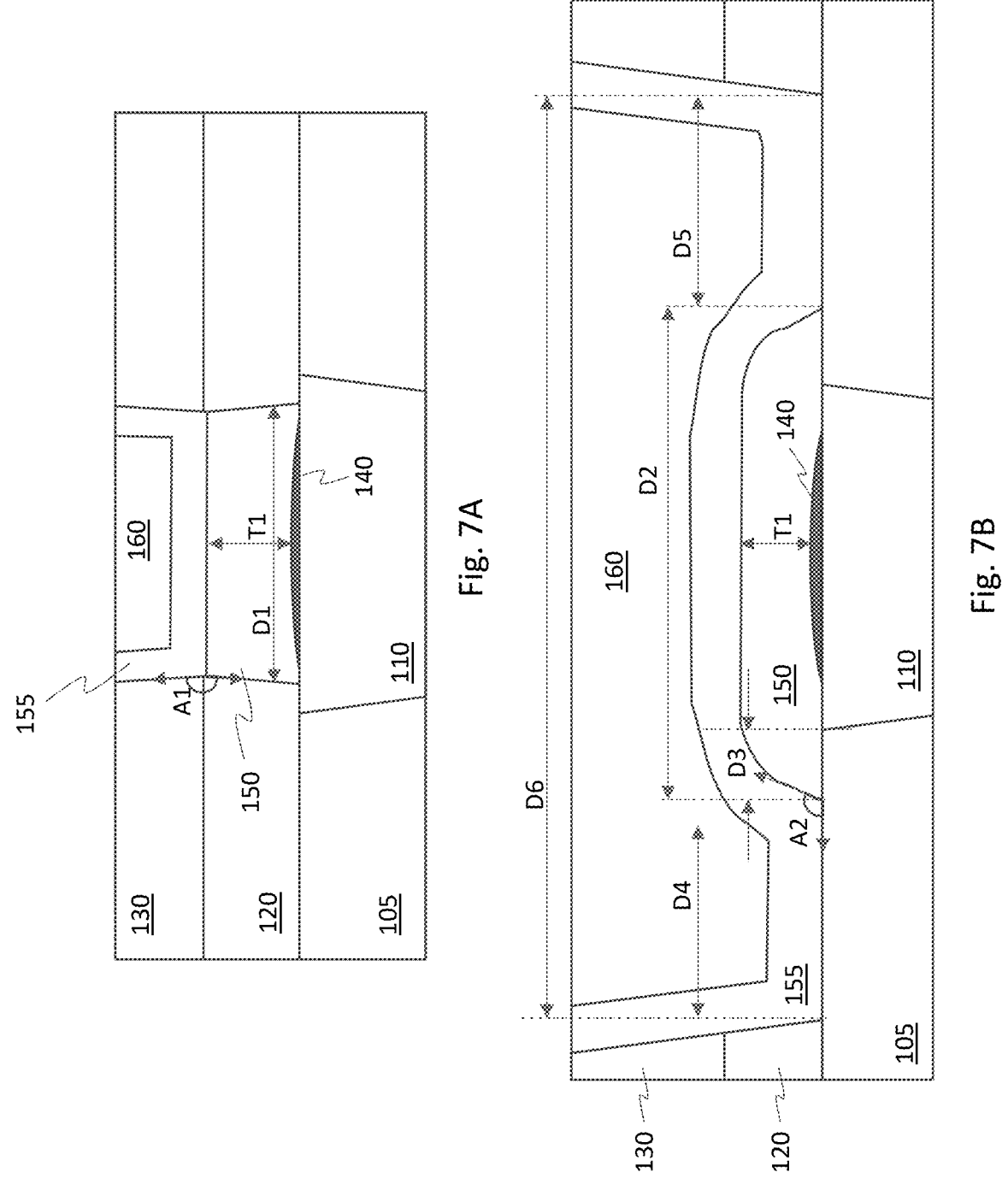

Referring briefly to FIGS. 7A and 7B, FIG. 7A illustrates a first cross section through the metal cap 150 and also illustrates embodiments where the opening 135 (FIG. 3A) is narrower than or about the same width as the upper surface of the conductive feature 110. The views of FIGS. 7A and 7B are enlarged views of the dashed boxes F7A and F7B, respectively, of FIGS. 6A and 6B. In FIG. 7A, the width D1 of the metal cap 150 extends from one sidewall of the ESL 120 to another sidewall of the ESL 120. In some embodiments, the width D1 may be between about 9 nm to 12 nm. The thickness T1 may be between 2 nm and 5 nm. The upper surface of the metal cap 150 does not extend, however, above the upper surface of the ESL 120 so as to contact the sidewalls of the second dielectric layer 130. In other words, the sidewalls of the second dielectric layer 130 are free from an interface with the metal cap 150. Due to the material composition of the ESL 120, the ESL 120 can contact the metal cap 150 without the need of a barrier layer between the metal cap 150 and the ESL 120. The second dielectric layer 130, however, may be made of other materials, including low-k compositions which would be more susceptible to metal diffusion from the metal cap 150. Thus, the metal cap 150 does not contact the second dielectric layer 130. In some embodiments, however, an uppermost surface of the metal cap 150 can extend above the uppermost surface of the ESL 120, for example, when the metal cap 150 has a domed shape. In such embodiments, the metal cap 150 still does not contact the second dielectric layer 130, even though a portion of the metal cap 150 may be vertically higher than the interface between the second dielectric layer 130 and the ESL 120.

FIG. 7B illustrates a second cross section through the metal cap 150 (on a different metal cap 150) and also illustrates embodiments where the opening 135 (FIG. 3B) is wider than the upper surface of the conductive feature 110. In FIG. 7B, the width D2 of the metal cap 150 may extend beyond the edge of the conductive feature 110 by the lateral protrusion distance D3. In some embodiments, the width D2 may be between about 15 nm and 30 nm and the distance D3 may be about 1 nm to about 3 nm. The distances D4 and D=from the edge of the metal cap 150 to the sidewall of the ESL 120 may each be between about 1 nm and 6 nm, in some embodiments. In other embodiments, one or more of the distances D4 or D5 may be o, or in other words, the metal cap 150 may contact the sidewall of the ESL 120. The absolute value of the difference between the distances D4 and D5 may be between about 0 nm and 2 nm. The width D6 from sidewall to sidewall may be between about 20 nm and 30 nm in some embodiments.

Metal caps 150 that have a greater thickness T1 may also have a greater lateral protrusion distance D3. In some embodiments, the lateral protrusion distance D3 may be between about 50% to 150% of the thickness T1.

Referring to FIGS. 4A and 4B, barrier layer 155 is formed. In accordance with some embodiments, barrier layer 155 is formed of or comprises one or more layers of titanium, titanium nitride, tantalum, tantalum nitride, or the like. There may also be a metal seed layer (not shown) formed over barrier layer 155. The barrier layer 155 protects the second dielectric layer 130 from diffusion and metallic poisoning. The seed layers may comprise copper, titanium, nickel, gold, manganese, a combination thereof, a multilayer thereof, or the like, and may be formed by ALD, CVD, PVD, sputtering, a combination thereof, or the like. The barrier layer 155 and the seed layer may be formed as conformal layers. The metal seed layer may be formed of or comprise copper, and may be formed, for example, using PVD. The barrier layer 155 thickness and the metal seed thickness may each be in the range between about 5 Å and about 20 Å.

The barrier layer 155 may also be formed on an exposed portion of the first dielectric layer 105 and encapsulates the metal cap 150. Referring again briefly to FIGS. 7A and 7B, in FIG. 7A for embodiments where the width of the opening 135 is smaller than or similar to the width of the conductive feature 110, the angle A1 between the barrier layer 155 and the metal cap 150 may be between about 110° and 150°. In FIG. 7B for embodiments where the width of the opening 135 is larger than the width of the conductive feature 110, the angle A2 between the barrier layer 155 and the metal cap 150 may be between about 110° and 150°.

The barrier layer 155 is formed without breaking vacuum from depositing the metal cap 150. Thus, the metal cap 150 is not exposed to oxygen and the presence of native oxide at the surface of the metal cap is only in trace amounts if at all in forming the barrier layer 155 after forming the metal cap 150. As a result, the interface of the conductive material 160 (see FIGS. 5A and 5B), barrier layer 155, and metal cap 150 are effectively enlarged to provide better conductivity and reduced resistivity.

Figures 5A, 5B, 6A, 6B:
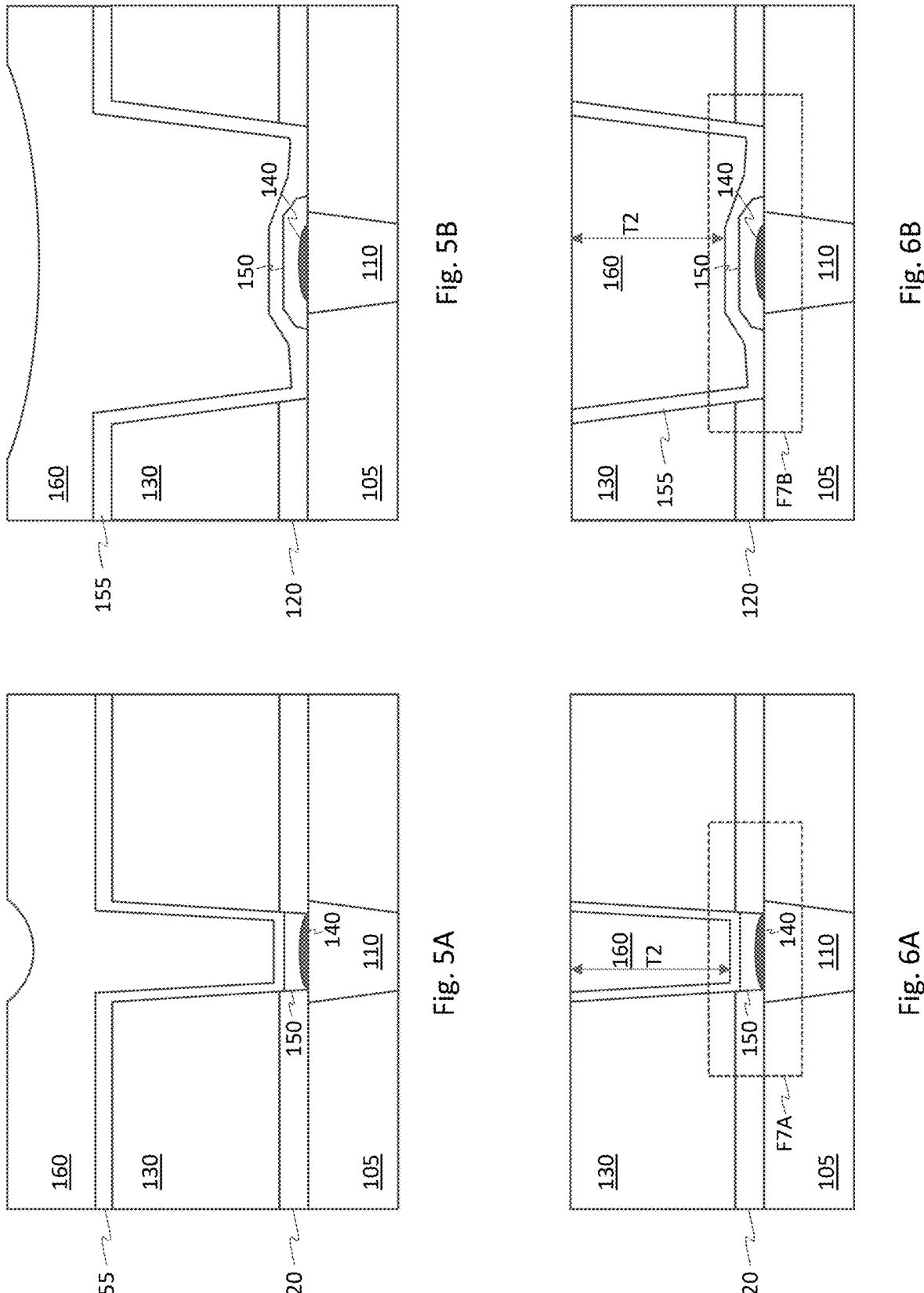

Referring to FIGS. 5A and 5B, a conductive material 160 is deposited over the barrier layer 155. The conductive material 160 may comprise copper, aluminum, tungsten, cobalt, ruthenium, combinations thereof, alloys thereof, multilayers thereof, or the like, and may be formed using, for example, plating, or other suitable methods. For example, the deposition process may include Electro Chemical Plating (ECP), electroless plating, CVD, PVD, ALD, or the like. Conductive material 160 fully fills openings 135 and may extend above the upper surface of the second dielectric layer 130.

In FIGS. 6A and 6B, a planarization process such as a Chemical Mechanical Polish (CMP) process or a mechanical grinding process is performed to remove excess portions of the conductive material 160 and barrier layer 155 (and seed layer, if used). The planarization process may be stopped on the top surface of the second dielectric layer 130. The planarization process may also be performed to remove a top portion of the second dielectric layer 130. The thickness T2 of the conductive material 160 after the planarization process may be between about 14 nm and 17 nm, though other thicknesses may be used depending on the thickness of the second dielectric layer 130.

Additional dielectric layers may be formed over the second dielectric layer 130 and vias, metal lines, or other conductive features may be formed within such additional dielectric layers. Such conductive features may be formed utilizing the selective metal deposition process described herein or other processes. Additional interconnect layers, for example may be formed at other thicknesses and have larger cross-sections which are not as susceptible to the native oxide described above.

Figure 8:
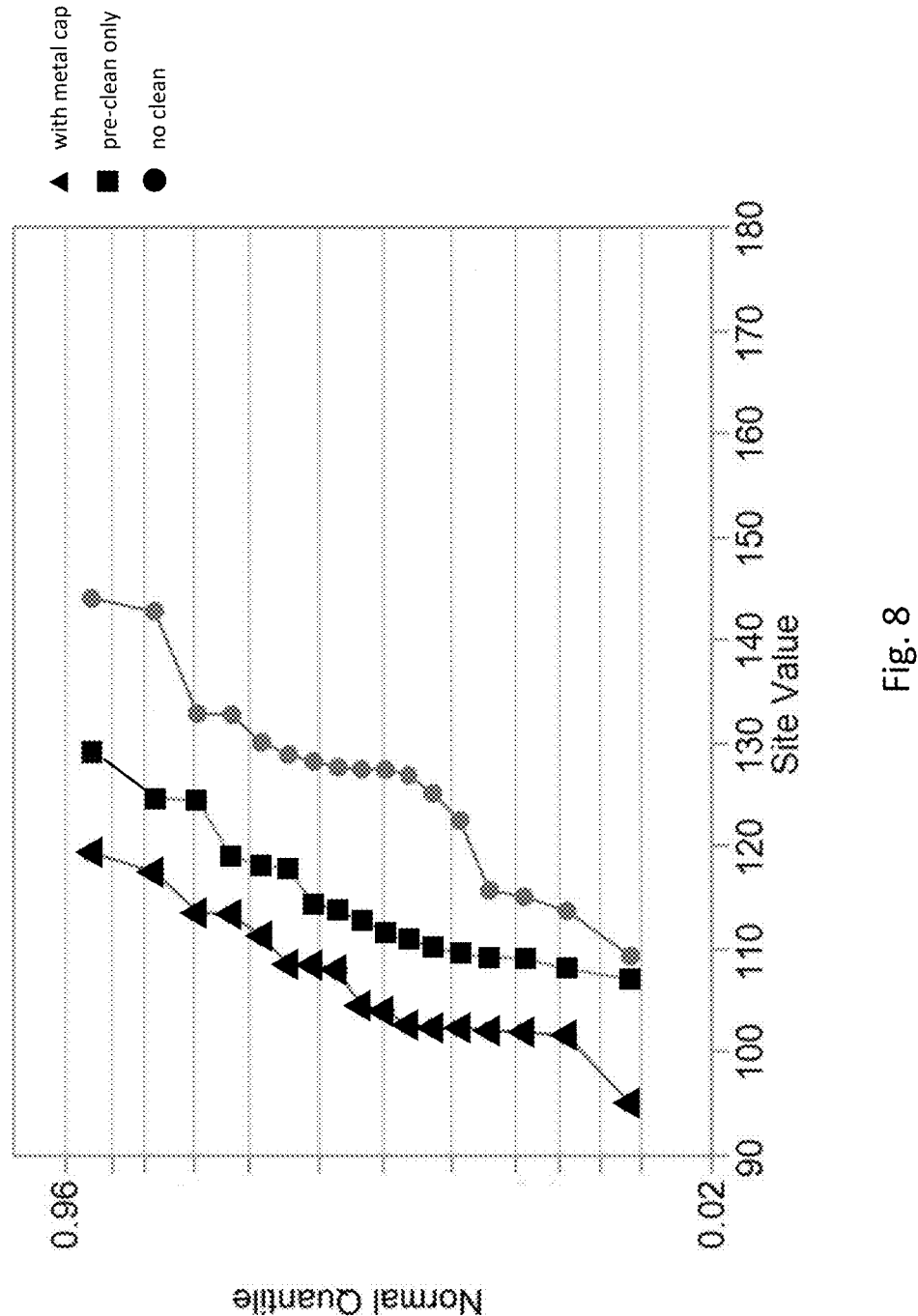
FIG. 8 illustrates sample interconnect performance, in accordance with some embodiments.

FIG. 8 illustrates a graph that demonstrates the lower achieved contact resistance when the embodiment processes are used. The triangle plots represent the embodiment processes utilizing the metal cap, the square plots represent a pre-clean process only, and the circle plots represent no cleaning process on the conductive feature 110. As seen in FIG. 8, sample test values demonstrate a better performance (lower contact resistance) for every sample quartile when the metal cap is utilized, as described herein.

Embodiments achieve advantages. By utilizing a selective metal deposition on a conductive feature to create metal cap prior to depositing a barrier layer, the contact area of the conductive feature can be enhanced while reducing the effect of native oxide at the interface between the metal cap and the conductive feature. While a pre-clean process may be utilized to remove some of the native oxide, some of the native oxide will remain at the interface of the metal cap and the conductive feature. A subsequently deposited barrier layer and conductive material can be used to fill the remainder of the contact opening to achieve a metal interconnect with a lower resistance with an underlying via or other conductive feature.

One embodiment is a method including depositing a dielectric layer over a conductive feature. The method also includes patterning the dielectric layer to form an opening in the dielectric layer, the opening exposing a first portion of the conductive feature. The method also includes selectively depositing a metal cap over the conductive feature. The method also includes depositing a barrier layer on a sidewall of the opening and over the metal cap. In an embodiment, the metal cap includes tungsten. In an embodiment, the method includes depositing a conductive fill over the barrier layer, and planarizing the conductive fill to level an upper surface of the conductive fill with an upper surface of the dielectric layer. In an embodiment, the method includes depositing an etch stop layer over the conductive feature before depositing the dielectric layer, and patterning the etch stop layer after patterning the dielectric layer. In an embodiment, the metal cap contacts sidewalls of the etch stop layer. In an embodiment, the dielectric layer is free from an interface with the metal cap. In an embodiment, the dielectric layer is a first dielectric layer, where the opening exposes a second dielectric layer underlying the first dielectric layer, the conductive feature embedded in the first dielectric layer, where patterning the first dielectric layer exposes a portion of the second dielectric layer. In an embodiment, the metal cap extends laterally beyond lateral extents of the conductive feature and along an upper surface of the second dielectric layer. In an embodiment, after depositing the metal cap, a native oxide of the conductive feature is sandwiched between the metal cap and the conductive feature. In an embodiment, prior to depositing the method further includes the metal cap, performing a cleaning process to remove a portion of the native oxide from the conductive feature.

Another embodiment is a method including forming a dielectric layer over a first conductive feature. The method also includes forming an opening in the dielectric layer, the opening exposing a first portion of the first conductive feature. The method also includes forming a second conductive feature in the opening, where forming the second conductive feature includes: forming a metal cap on the first conductive feature exposed by the dielectric layer; without breaking vacuum, forming a barrier layer on the metal cap and on sidewalls of the opening; and depositing a conductive fill over the barrier layer. In an embodiment, the method includes, prior to forming the second conductive feature, performing a first cleaning process to remove a first portion of a native oxide of the first conductive feature, where forming the metal cap encapsulates a second portion of the native oxide between the metal cap and the first conductive feature. In an embodiment, the method further includes forming an etch stop layer prior to forming the dielectric layer, the opening extending through the etch stop layer to expose the first portion of the first conductive feature. In an embodiment, the metal cap contacts sidewalls of the etch stop layer. In an embodiment, the opening is narrower than an upper surface of the first conductive feature.

Another embodiment is a structure including a first conductive feature embedded in a first dielectric layer. The structure also includes an etch stop layer disposed over the first dielectric layer. The structure also includes a second dielectric layer disposed over the etch stop layer. The structure also includes a metal cap disposed over the first conductive feature. The structure also includes a barrier layer embedded in the second dielectric layer, the barrier layer extending down to contact an upper surface of the metal cap. The structure also includes a conductive fill disposed over the metal cap and embedded in the second dielectric layer, the barrier layer laterally encapsulating the conductive fill. In an embodiment, the structure further includes a native oxide of the first conductive feature embedded at an interface between the metal cap and the first conductive feature. In an embodiment, the metal cap includes tungsten (W). In an embodiment, the first conductive feature includes cobalt (Co), ruthenium (Ru), copper (Cu), molybdenum (Mo), or tungsten (W). In an embodiment, the metal cap is laterally wider than an upper surface of the first conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

depositing a dielectric layer over a conductive feature;

patterning the dielectric layer to form an opening in the dielectric layer, the opening exposing a first portion of the conductive feature, wherein a native oxide is formed over the conductive feature after patterning the dielectric layer;

only partially removing the native oxide, wherein a remaining native oxide remains on the conductive feature after only partially removing the native oxide;

selectively depositing a metal cap over the remaining native oxide and the conductive feature; and depositing a barrier layer on a sidewall of the opening and over the metal cap.

2. The method of claim 1, wherein the metal cap comprises tungsten.

3. The method of claim 1, further comprising:

depositing a conductive fill over the barrier layer; and planarizing the conductive fill to level an upper surface of the conductive fill with an upper surface of the dielectric layer.

4. The method of claim 1, further comprising:

depositing an etch stop layer over the conductive feature before depositing the dielectric layer; and patterning the etch stop layer after patterning the dielectric layer.

5. The method of claim 4, wherein the metal cap contacts sidewalls of the etch stop layer.

6. The method of claim 1, wherein the dielectric layer is free from an interface with the metal cap.

7. The method of claim 1, wherein the dielectric layer is a first dielectric layer, wherein the opening exposes a second dielectric layer underlying the first dielectric layer, the conductive feature embedded in the first dielectric layer, wherein patterning the first dielectric layer exposes a portion of the second dielectric layer.

8. The method of claim 7, wherein the metal cap extends laterally beyond lateral extents of the conductive feature and along an upper surface of the second dielectric layer.

9. A method comprising:

forming a dielectric layer over a first conductive feature;

forming an opening in the dielectric layer, the opening exposing a first portion of the first conductive feature, wherein an oxide layer is formed on the first conductive feature; and forming a second conductive feature in the opening, wherein forming the second conductive feature comprises:

performing a partial pre-clean process, the partial pre-clean process only partially removing the oxide layer on the first conductive feature;

forming, in a vacuum, a metal cap on remaining portions of the oxide layer and the first conductive feature exposed by the dielectric layer;

without breaking vacuum, forming a barrier layer on the metal cap and on sidewalls of the opening; and depositing a conductive fill over the barrier layer.

10. The method of claim 9, further comprising:

forming an etch stop layer prior to forming the dielectric layer, the opening extending through the etch stop layer to expose the first portion of the first conductive feature.

11. The method of claim 10, wherein the metal cap contacts sidewalls of the etch stop layer.

12. The method of claim 9, wherein the opening is narrower than an upper surface of the first conductive feature.

13. A structure comprising:

a first conductive feature embedded in a first dielectric layer;

an etch stop layer disposed over the first dielectric layer;

a second dielectric layer disposed over the etch stop layer;

a native oxide layer on the first conductive feature;

a metal cap disposed over the native oxide layer and the first conductive feature;

a barrier layer embedded in the second dielectric layer, the barrier layer extending down to contact an upper surface of the metal cap; and a conductive fill disposed over the metal cap and embedded in the second dielectric layer, the barrier layer laterally encapsulating the conductive fill.

14. The structure of claim 13, wherein the metal cap comprises tungsten (W).

15. The structure of claim 13, wherein the first conductive feature comprises cobalt (Co), ruthenium (Ru), copper (Cu), molybdenum (Mo), or tungsten (W).

16. The structure of claim 13, wherein the metal cap is laterally wider than an upper surface of the first conductive feature.

17. The structure of claim 13, wherein the metal cap has a thickness between about 2 nm and about 5 nm above the native oxide layer.

18. The method of claim 1, wherein only partially removing the native oxide reduces the native oxide by between about 20% and about 60%.

19. The method of claim 1, wherein the metal cap has a thickness between about 2 nm and about 5 nm above the remaining native oxide.

20. The method of claim 1, wherein depositing the barrier layer and selectively depositing the metal cap are performed in a same vacuum chamber without breaking vacuum.

* * * * *